(12) United States Patent
Lin et al.

(10) Patent No.: US 8,188,607 B2
(45) Date of Patent: May 29, 2012

(54) LAYOUT STRUCTURE FOR CHIP COUPLING

(75) Inventors: Shao-Ping Lin, Hsinchu (TW);
Shuo-Yen Hung, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 394 days.

(21) Appl. No.: 11/941,631

(22) Filed: Nov. 16, 2007

(65) Prior Publication Data

US 2008/0246167 A1    Oct. 9, 2008

(30) Foreign Application Priority Data

Apr. 4, 2007    (TW) ................................ 96112142 A

(51) Int. Cl.
   *H01L 23/48*      (2006.01)

(52) U.S. Cl. ........ 257/786; 257/775; 349/149; 349/152; 438/612; 438/666

(58) Field of Classification Search .......... 349/149–152; 257/786, E23.015; 350/336; 438/612, 666
See application file for complete search history.

(56) References Cited

U.S. PATENT DOCUMENTS

| | | | |
|---|---|---|---|
| 4,586,789 A * | 5/1986 | Kishimoto et al. ........... | 349/152 |
| 6,930,744 B1 * | 8/2005 | Ukita ........................... | 349/152 |
| 2002/0041355 A1 | 4/2002 | Yamazaki et al. | |
| 2002/0191140 A1 * | 12/2002 | Eguchi et al. ................ | 349/149 |
| 2004/0085504 A1 * | 5/2004 | Kim et al. ..................... | 349/149 |
| 2005/0082647 A1 * | 4/2005 | Lee et al. ..................... | 257/668 |
| 2007/0216002 A1 * | 9/2007 | Tanoue ........................ | 257/678 |

FOREIGN PATENT DOCUMENTS

| | | |
|---|---|---|
| CN | 1387256 | 12/2002 |
| JP | 7-87221 | 9/1995 |
| TW | 591310 | 6/2004 |
| TW | I276901 | 3/2007 |

OTHER PUBLICATIONS

Chinese language office action dated Apr. 25, 2008.
Remarks regarding relevance of CN 1387256.
Remarks regarding relevance of JP 7-87221.
Taiwan Office Action mailed Jun. 7, 2011.
English translation of Taiwan Office Action mailed Jun. 7, 2011.

* cited by examiner

*Primary Examiner* — Matthew E Warren
*Assistant Examiner* — Fang-Xing Jiang
(74) *Attorney, Agent, or Firm* — Thomas, Kayden, Horstemeyer & Risley, LLP

(57) ABSTRACT

A layout structure disposed on the substrate of the liquid crystal display (LCD) for chip coupling is provided. The first and second orientations that are substantially perpendicular to the first orientation can be defined on the substrate. The layout structure includes a plurality of lines, which extend along the second orientation, and a plurality of conductive pads that are respectively disposed on the lines. The conductive pads are distributed along the first orientation and staggered along the second orientation. Each line can shift away from the adjacent conductive pad on the first orientation. Thus, the LCD chip has a better conductivity and a thinner dimension under the precision of the conventional machines.

20 Claims, 5 Drawing Sheets

LAYOUT STRUCTURE FOR CHIP COUPLING

This application claims the benefits of the priority based on Taiwan Patent Application No. 096112142 filed on Apr. 4, 2007; the disclosure of which is incorporated by reference herein in its entirety.

CROSS-REFERENCES TO RELATED APPLICATIONS

Not Applicable

BACKGROUND OF THE INVENTION

1. Field of the Invention

The present invention relates to a layout structure for chip coupling, and more particularly to a layout structure that can ensure an electrical connection with a chip and thereby reduce the chip size, under the precision of the conventional machine.

2. Descriptions of the Related Art

Liquid crystal displays (LCDs) have replaced conventional displays and become mainstream products due to their low power consumption, light weight, low radiation and portability. In addition to key parts, such as a backlight module, liquid crystals and a color filter, an integrated circuit (IC) chip and a layout structure of the display panel are provided for converting external signals into control signals to control the luminance of each pixel.

In a conventional LCD 10, as depicted in FIG. 1, a layout structure 13 is formed on a glass substrate 11. An IC chip 15 is disposed at the lowermost edge of the glass substrate 11 to electrically connect with the layout structure 13 and connect to a flexible printed circuit (FPC) 17 on the other side. During operation, external signals are transferred through the FPC 17 to the IC chip 15 and are converted into control signals to control the luminance of each pixel through the layout structure 13.

The most common conventional technology used for bonding the IC chip 15 to the glass substrate 11 is the chip on glass (COG) technology. By the COG technology, the IC chip 15 with bumps is directly bonded onto the layout structure 13 of the glass substrate 11. FIGS. 2A and 2B illustrate two partially enlarged schematic views of the layout structure 13 disposed on the glass substrate 11 and connected with the IC chip 15. The layout structure 13 comprises a plurality of lines 131 and a plurality of conductive pads 133 corresponding to the bumps on the IC chip 15. When the IC chip 15 is overlaid onto the layout structure 13, the bumps of the IC chip 15 will be correspondingly bonded with the conductive pads 133 of the layout structure 13 to establish an electrical conduction state therebetween through the conductive particles.

However, there are still issues with the aforesaid structure. Still referring to FIGS. 2A and 2B, a conventional conductive pad layout design for dual-line routing is depicted in FIG. 2A, while a conventional conductive pad layout design for triple-line routing is depicted in FIG. 2B. Typically, in conventional technology, the conductive pads 133 are approximately the same in size as the bumps of the IC chip 15 so that the bumps can come into contact exactly with the conductive pads 133 after the bonding process. However, if the preciseness of the machine is not enough, the bumps may shift from the desired position. Such a shift will lead to a reduced contact area between the bumps and the conductive pads 133, thus, making the electrical conductivity therebetween inadequate. Furthermore, such bumps may come into contact with adjacent lines 131, eventually leading to short-circuits or product failures.

Consequently, in conventional technology, an adequate spacing is maintained between the conductive pads 133 and their adjacent lines 131 to prevent the bumps from coming into contact with the adjacent lines 131 due to the IC chip 15 shift during the bonding process. During the manufacturing process, a finer spacing between the individual lines 131 or between the individual conductive pads 133 is preferred to reduce the size of the final product. However, if there is a shift during the chip bonding process, then a large spacing between the conductive pads 133 and the adjacent lines 131 would be preferred. Thus, these two objectives contradict each other, making it difficult for the designers to account for both situations. In addition, the spacing maintained between the conductive pads 133 and the lines 131 is estimated according to the machine precision, the inaccuracy of the feed materials or the process stability criteria evaluated by the manufacturers. Thus, the machine precision, the inaccuracy of the feed materials or the process stability criteria evaluated by the manufacturers will also affect the IC chip 15 design dimensions.

In the conventional process, the IC chip 15 has to be made with excessive footprints, which causes the display area to shrink correspondingly, due to the limitations of the stability and manufacturing capability of the bonding machine. As a result, the IC chip 15 is undesirable for the miniaturization of the LCD products. On the contrary, if a smaller IC chip 15 is desired for the LCD, a bonding machine of higher precision will become a necessity, which will increase the manufacturing cost of the LCD.

Given the above, a novel layout structure that meets the manufacturing process criteria under the precision of conventional bonding machines needs to be developed in this field.

SUMMARY OF THE INVENTION

One objective of this invention is to provide a layout structure for chip coupling. The lines in the layout structure are distributed non-linearly; that is, the lines can shift in accordance with the adjacent conductive pads. In this way, the safety margin can be improved to tolerate the chip shift due to limited precision of the bonding machine. In addition, the chip bonding process can satisfy the process criteria using the existing bonding machine. Furthermore, the short circuits that arise from the contact between the bumps of the IC chip and the lines are prevented.

Another objective of this invention is to provide a layout structure for chip coupling. Since the lines are able to shift, the layout structure allows a further enlargement of the conductive pads. As a result, the electrical conduction between the bumps of the IC chip and the conductive pads can be ensured during the chip bonding process to maintain an effective electrical conductivity therebetween. The minimum compression area can also be more effectively utilized. In this way, the bonding area can be enlarged without having to design larger bumps.

Yet a further objective of this invention is to provide a layout structure for chip coupling. Since the bumps shrink in size and the aspect ratio thereof is adjustable, the footprint of the IC chip is reduced, and therefore, the chip is miniaturized. Accordingly, a wafer of the same size can yield more chips than before, thus, further lowering the manufacturing costs.

To achieve the aforementioned objectives, the present invention discloses a layout structure disposed on the substrate of a liquid crystal display (LCD) for chip coupling. The first and second orientations that are substantially perpendicular to each other can be defined on the substrate. The layout structure comprises a plurality of lines that are substantially parallel to each other and extend along the second orientation. There is also a plurality of conductive pads respectively disposed on the lines. The adjacent conductive pads are distributed in sequence along the first orientation and staggered along the second orientation. Each line has a shifting portion that departs from the adjacent conductive pad on the first orientation. The shifting portion of the lines comprises a main section that is disposed substantially parallel to the second orientation and the two connecting sections connecting the two ends of the main section respectively. There is an included angle substantially greater than 90 degrees that is formed between the main section and the connecting sections.

The detailed technology and preferred embodiments implemented for the subject invention are described in the following paragraphs accompanying the appended drawings for people skilled in this field to well appreciate the features of the present invention.

DESCRIPTION OF THE PREFERRED EMBODIMENT

Figure 1:
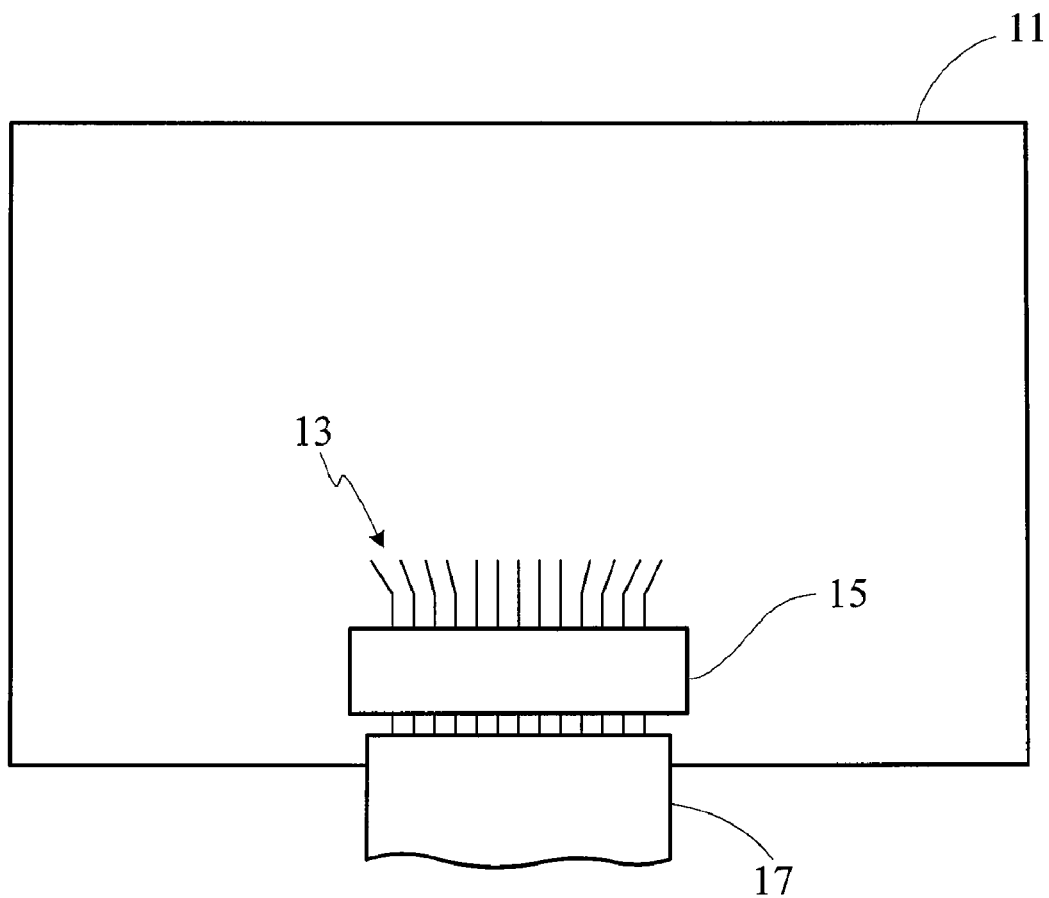
FIG. 1 is a schematic view of a conventional liquid crystal display.
Figure 2A:
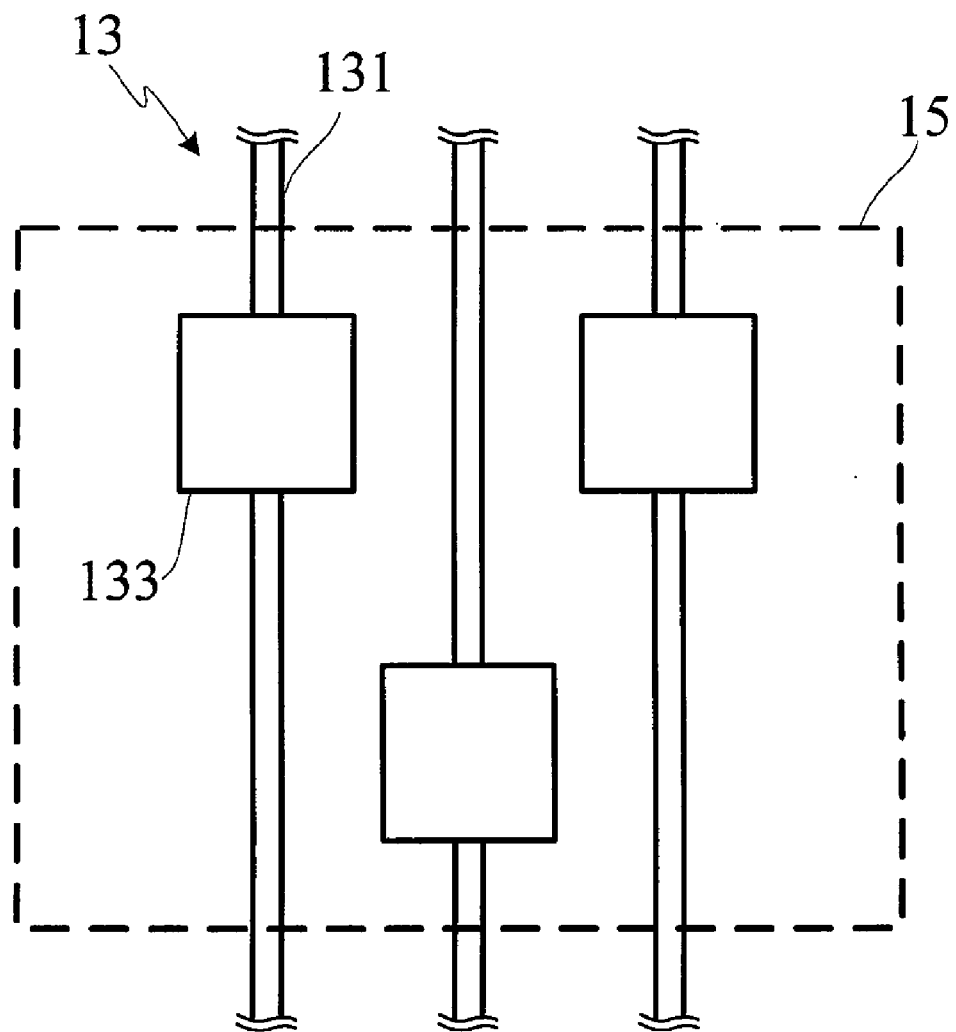
FIG. 2A is a schematic view of a layout structure in a conventional dual-line routing design.
Figure 2B:
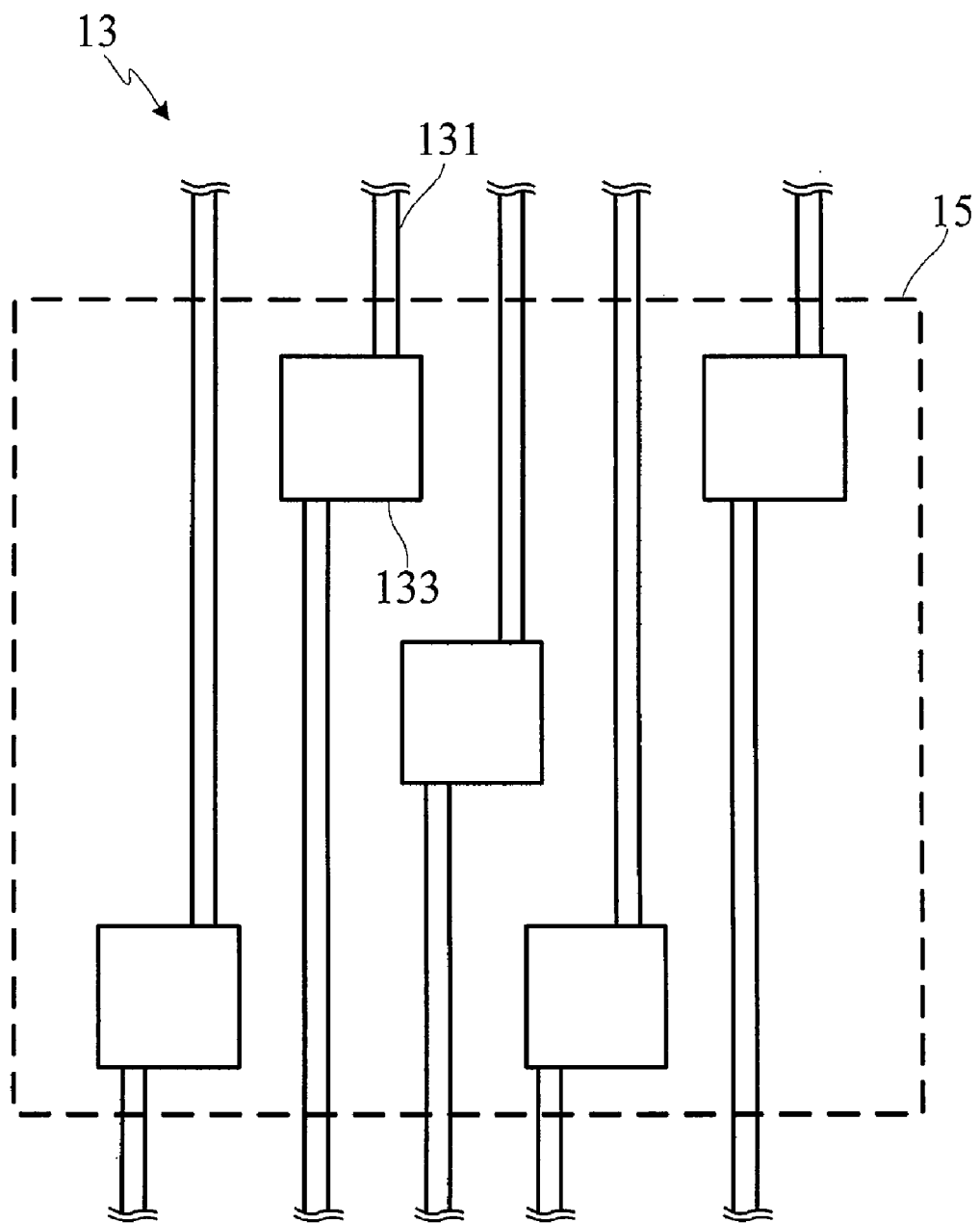
FIG. 2B is a schematic view of a layout structure in a conventional triple-line routing design.
Figure 3:
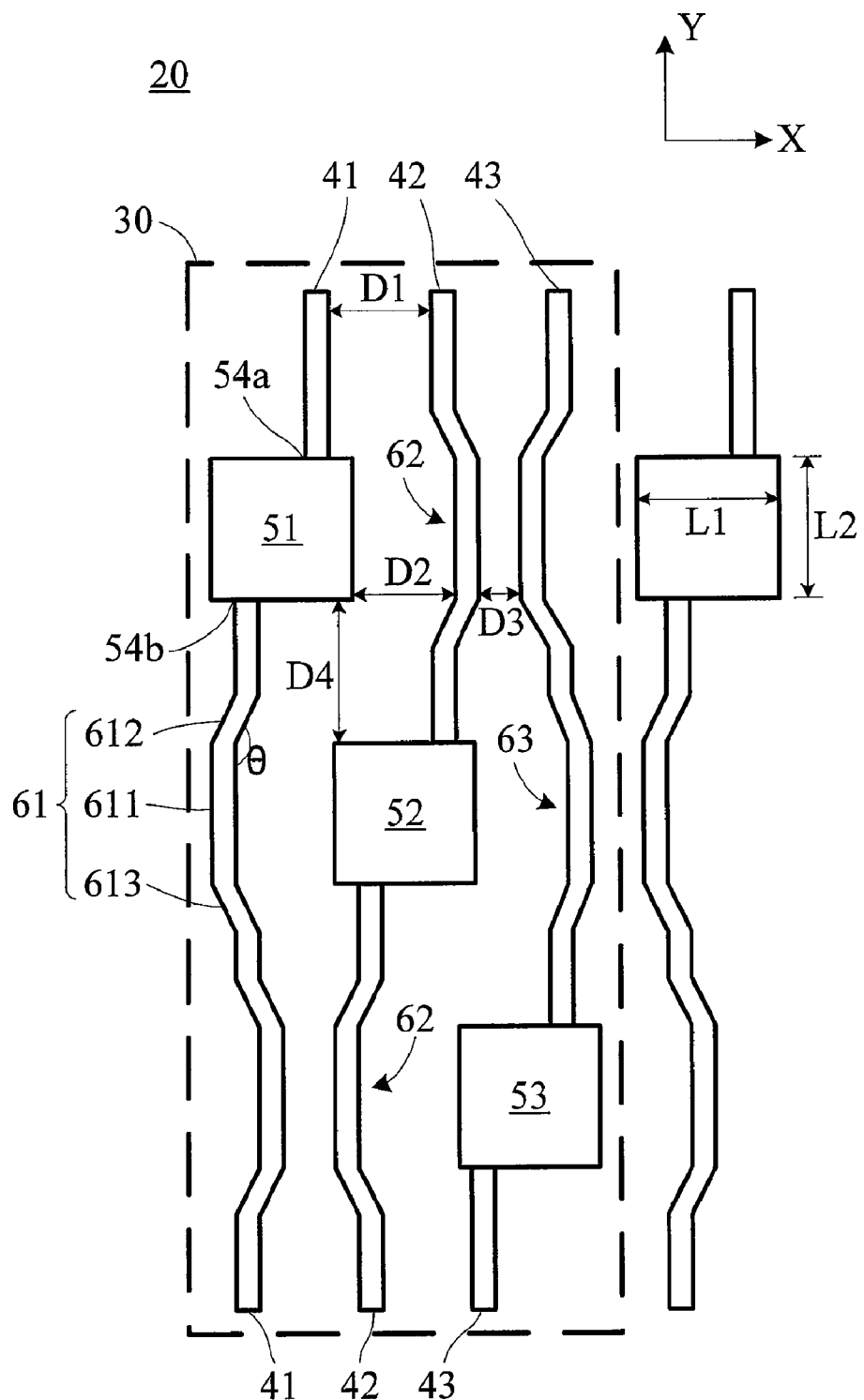
FIG. 3 is a schematic view of a preferred embodiment of the present invention.

FIG. 3 illustrates a layout structure 20 that is disposed on the substrate of a liquid crystal display (LCD) for chip coupling. For illustration convenience, the first orientation X and second orientation Y that are substantially perpendicular to each other can be defined in the substrate. The layout structure 20 of the present invention has at least one unit 30 comprising a plurality of lines and conductive pads. In this embodiment, the conductive pads and bumps on the IC chip are approximately of the same area and can be electrically connected together once they are bonded together.

In particular, the plurality of lines comprise of a first line 41, a second line 42 and a third line 43, all substantially parallel to each other and extending along the second orientation Y. The plurality of conductive pads comprise of a first conductive pad 51, a second conductive pad 52 and a third conductive pad 53 that are disposed on the first line 41, the second line 42 and the third line 43, respectively. With respect to the distribution of the conductive pads, the first conductive pad 51, the second conductive pad 52 and the third conductive pad 53 are distributed in sequence along the first orientation X and staggered along the second orientation Y to form a conductive pad layout design for triple-line routing, as illustrated in FIG. 3.

The first conductive pad 51 will be used as an example to describe the bonding between the conductive pads and lines. The first conductive pad 51 has two connecting ends 54a, 54b that are independently disposed on both sides along the second orientation Y and are staggered along the first orientation X to connect with the line 41 respectively. Other conductive pads and lines of the present invention are similar and will not be described herein.

In the preferred embodiments of the present invention, each line has a shifting portion and is able to shift from the adjacent conductive pad along the first orientation X. As illustrated in FIG. 3, the first line 41, the second line 42 and the third line 43 respectively have a first shifting portion 61, a second shifting portion 62 and a third shifting portion 63 departing from the adjacent conductive pads along the first orientation X.

For example, the first shifting portion 61 comprises a main section 611 substantially disposed parallel to the second orientation Y, and two connecting sections 612, 613 respectively connecting with the two ends of the main section 611. More specifically, an included angle θ greater than 90 degrees can be formed between the main section 611 and the connecting sections 612, 613. In the preferred embodiments, the included angle θ ranges from 90 to 180 degrees. In other words, in unit 30, the first line 41 has a first shifting portion 61 departing from the adjacent second conductive pad 52, the second line 42 has second shifting portions 62 departing from both the adjacent first conductive pad 51 and the third conductive pad 53, and the third line 43 has a third shifting portion 63 departing from the adjacent second conductive pad 52.

It should be noted that, as shown in FIG. 3, the pad layout design of the triple-line routing features two adjacent conductive pads for each line, one on each side. Certainly, each line has two shifting portions that respectively depart from the two adjacent conductive pads along the first orientation X.

In this embodiment, the line shifts allow the spacing between the lines and their adjacent conductive pads to be substantially enlarged, and thus, there is a higher tolerance when the chip shifts due to the imprecision of the machine.

In this embodiment, the adjacent lines that are substantially parallel to each other define a first interval D1 therebetween. Each of the conductive pads and the shifting portions of their adjacent lines define a second interval D2 therebetween. Likewise, the adjacent shifting portions define a third interval D3 therebetween, and the adjacent conductive pads define a fourth interval D4 therebetween along the second orientation Y. For example, in the preferred embodiments, the first interval D1 is about 16 μm, the second interval D2 is about 13 μm, the third interval D3 is about 4 μm, and the fourth interval D4 is about 40 μm. In other words, the proportion of the second interval D2 to the first interval D1 is about 1.3, the proportion of the third interval D3 to the first interval D1 is about 0.4, and the proportion of the fourth interval D4 to the second interval D2 is about 3.

In addition, each of the conductive pads can be defined with a transverse dimension L1 along the first orientation X and a lengthwise dimension L2 along the second orientation Y. For example, in the preferred embodiments, the transverse dimension L1 is about 19 μm, and the lengthwise dimension L2 is about 126 μm. In other words, the proportion of the lengthwise dimension L2 to the transverse dimension L1 is about 6.63.

Figure 4:
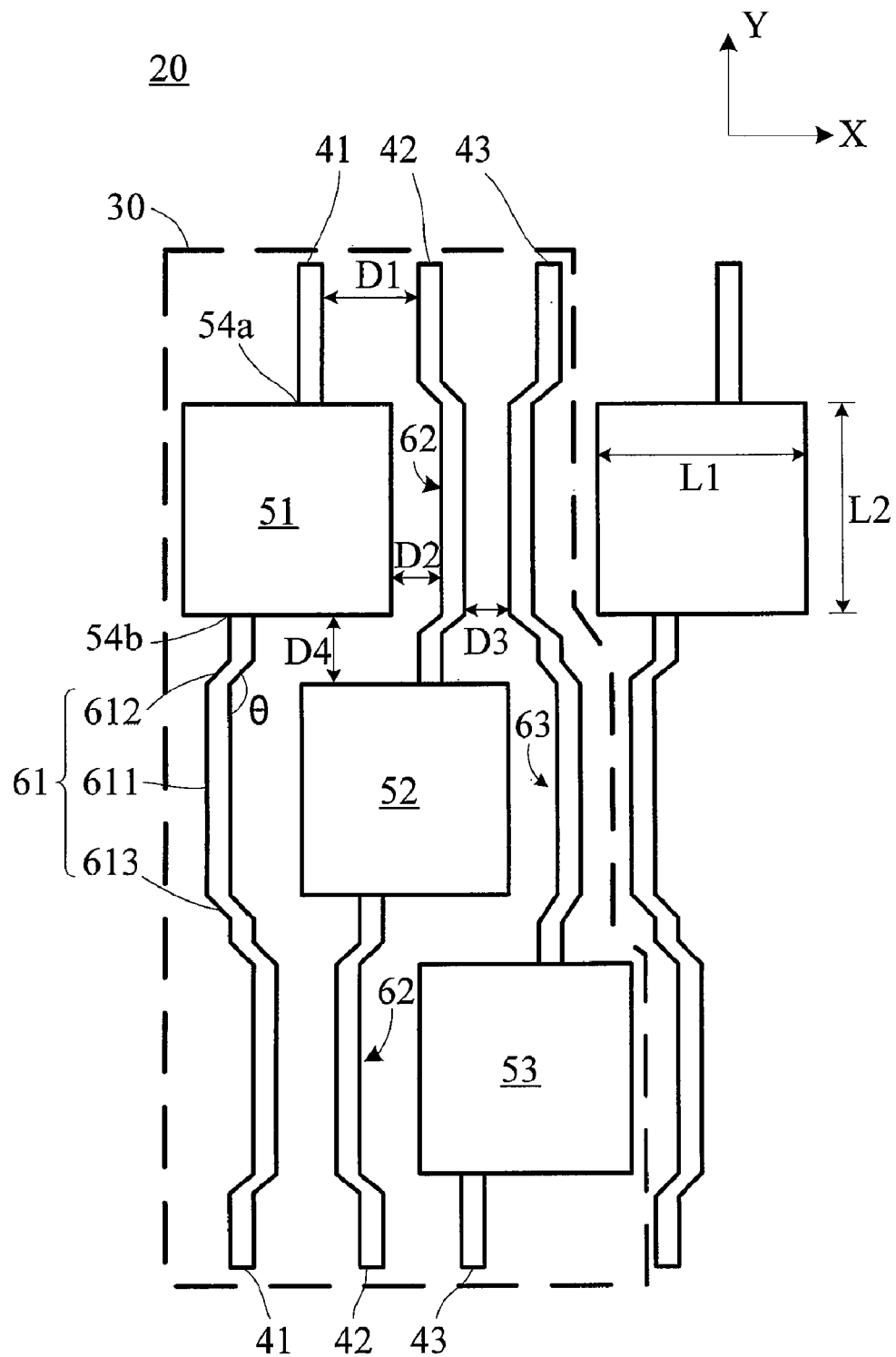
FIG. 4 is a schematic view of another preferred embodiment of the present invention.

Another preferred embodiment of the present invention is shown in FIG. 4. The main structure of this embodiment is similar to the aforesaid embodiment and will not be further described. In this embodiment, the conductive pads can be appropriately enlarged so that even if the bumps slightly shift during the chip bonding process due to the imprecision of the machine, an effective conduction can still be established between the bumps and the conductive pads. Furthermore, since the conductive pads have a larger area than that of the bumps, there is no need to design large bumps to ensure an electrical conduction in the conventional technologies. Moreover, the dimensions of the IC chip along the second orientation Y can be reduced through a flexible design of the bump size, such as adjusting the length and transverse of the bumps.

In this embodiment, the first interval D1 is still about 10 µm, the second interval D2 is about 5 µm, the third interval D3 is about 5 µm, and the fourth interval D4 is about 20 µm. In other words, the proportion of the second interval D2 to the first interval D1 is about 0.5, the proportion of the third interval D3 to the first interval D1 is about 0.5, and the proportion of the fourth interval D4 to the second interval D2 is about 4.

In addition, in the preferred embodiments, the transverse dimension L1 is about 34 µm, and the lengthwise dimension L2 is about 98 µm. In other words, the proportion of the lengthwise dimension L2 to the transverse dimension L1 is about 2.88. It should be noted that these dimension values are intended only to illustrate and not to limit the present invention.

It is apparent from the above disclosure that the present invention exhibits a higher tolerance towards the imprecision of the machine during the chip bonding process due to the lines ability to shift. In addition, the bumps are less likely to come into contact with the other lines. Furthermore, the line shifting ability can enlarge the area of the conductive pads. As a result, the bumps can be adjusted simultaneously to reduce the size of the IC chip and therefore lower the manufacturing costs.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A physical layout structure for chip coupling, the physical layout structure being disposed on a substrate which is defined with a first orientation and a second orientation substantially perpendicular to the first orientation, the physical layout structure having at least one unit comprising:
a plurality of lines, being substantially parallel and extending along the second orientation; and
a plurality of conductive pads, respectively disposed in the plurality of lines, in which each of the plurality of conductive pads is distributed along the first orientation and staggered along the second orientation corresponding to the adjacent conductive pad;
wherein each of the plurality of lines has at least one shifting portion stepping aside and departing from a corresponding one of the adjacent conductive pads in the first orientation, and wherein each of the shifting portions comprises a main section substantially disposed parallel to the second orientation and two connecting sections respectively connecting with two ends of the main section, in which two included angles being formed by the main section and the connecting sections are both substantially greater than 90 degrees and facing towards the corresponding one of the adjacent conductive pads;
wherein each of the conductive pads has two connecting ends respectively disposed on two sides of the conductive pad along the second orientation, in which the two connecting ends are staggered apart from each other on the first orientation to separately connect with a line.

2. The physical layout structure as claimed in claim 1, wherein the plurality of conductive pads include a first conductive pad, a second conductive pad and a third conductive pad, and the plurality of lines include a first line, a second line and a third line, wherein the first, second, and third lines are provided for the first conductive pad, the second conductive pad and the third conductive pad, respectively.

3. The physical layout structure as claimed in claim 2, wherein the first line, the second line and the third line have a first shifting portion, a second shifting portion and a third shifting portion departing from the adjacent conductive pads along the first orientation, respectively.

4. The physical layout structure as claimed in claim 2, wherein the first line has a first shifting portion departing from the adjacent second conductive pad, the second line has a second shifting portion departing from the adjacent first and third conductive pads, and the third line has a third shifting portion departing from the adjacent second conductive pad.

5. The physical layout structure as claimed in claim 1, wherein the adjacent lines define a first interval therewith, and each of the conductive pads and the shifting portion of the adjacent line define a second interval therewith, in which the proportion of the second interval to the first interval ranges from about 0.5 to 1.3.

6. The physical layout structure as claimed in claim 5, wherein the adjacent shifting portions define a third interval therewith, in which the proportion of the third interval to the first interval ranges from about 0.4 to 0.5.

7. The physical layout structure as claimed in claim 6, wherein the adjacent conductive pads define a fourth interval therewith along the second orientation, in which the proportion of the fourth interval to the second interval ranges from about 3 to 4.

8. The physical layout structure as claimed in claim 1, wherein each of the conductive pads has a transverse dimension on the first orientation and a lengthwise dimension on the second orientation, in which the proportion of the lengthwise dimension to the transverse dimension ranges from about 2.88 to 6.63.

9. The physical layout structure as claimed in claim 1, wherein the included angle ranges from about 90 to 180 degrees.

10. The physical layout structure as claimed in claim 1, wherein the main section of the shifting portion departs from the corresponding one of the adjacent conductive pads in the first orientation.

11. A physical layout structure for chip coupling, the physical layout structure being disposed on a substrate which is defined with a bonding area, a first orientation and a second orientation substantially perpendicular to the first orientation, the physical layout structure having at least one bonding unit located within the bonding area, the at least one bonding unit comprising:
a plurality of lines, being substantially parallel and extending along the second orientation; and
a plurality of conductive pads, respectively disposed in the plurality of lines, in which each of the plurality of conductive pads is distributed along the first orientation and staggered along the second orientation corresponding to the adjacent conductive pad;
wherein each of the plurality of lines has at least one shifting portion stepping aside and departing from a corresponding one of the adjacent conductive pads in the first orientation, and wherein each of the shifting portion portions comprises a main section substantially disposed parallel to the second orientation and two connecting sections respectively connecting with two ends of the main section, in which two included angles being formed by the main section and the connecting sections are both substantially greater than 90 degrees and facing towards the corresponding one of the adjacent conductive pads;

wherein each of the conductive pads has two connecting ends respectively disposed on two sides of the conductive pad along the second orientation, in which the two connecting ends are staggered apart from each other on the first orientation to separately connect with a line.

12. The physical layout structure as claimed in claim 11, wherein the plurality of conductive pads include a first conductive pad, a second conductive pad and a third conductive pad, and the plurality of lines include a first line, a second line and a third line, wherein the first, second, and third lines are provided for the first conductive pad, the second conductive pad and the third conductive pad, respectively.

13. The physical layout structure as claimed in claim 12, wherein the first line, the second line and the third line have a first shifting portion, a second shifting portion and a third shifting portion departing from the adjacent conductive pads along the first orientation, respectively.

14. The physical layout structure as claimed in claim 12, wherein the first line has a first shifting portion departing from the adjacent second conductive pad, the second line has a second shifting portion departing from the adjacent first and third conductive pads, and the third line has a third shifting portion departing from the adjacent second conductive pad.

15. The physical layout structure as claimed in claim 11, wherein the adjacent lines define a first interval therewith, and each of the conductive pads and the shifting portion of the adjacent line define a second interval therewith, in which the proportion of the second interval to the first interval ranges from about 0.5 to 1.3.

16. The physical layout structure as claimed in claim 15, wherein the adjacent shifting portions define a third interval therewith, in which the proportion of the third interval to the first interval ranges from about 0.4 to 0.5.

17. The physical layout structure as claimed in claim 16, wherein the adjacent conductive pads define a fourth interval therewith along the second orientation, in which the proportion of the fourth interval to the second interval ranges from about 3 to 4.

18. The physical layout structure as claimed in claim 11, wherein each of the conductive pads has a transverse dimension on the first orientation and a lengthwise dimension on the second orientation, in which the proportion of the lengthwise dimension to the transverse dimension ranges from about 2.88 to 6.63.

19. The physical layout structure as claimed in claim 11, wherein the included angle ranges from about 90 to 180 degrees.

20. The physical layout structure as claimed in claim 11, wherein the main section of the shifting portion departs from the adjacent conductive pad in the first orientation.

* * * * *